(12) United States Patent
Beilfuss-Spickmann et al.

(10) Patent No.: US 12,431,641 B2
(45) Date of Patent: Sep. 30, 2025

(54) ELECTRIC DEVICE WITH PRINTED CIRCUIT BOARD

(71) Applicant: Lenze Swiss AG, Romanshorn (CH)

(72) Inventors: Uwe Beilfuss-Spickmann, Hessisch Oldendorf (DE); Benjamin Faessler, Waldstatt (CH); Ewgeni Hoffmann, Aerzen (DE); Christof Schneggenburger, Guettingen (CH)

(73) Assignee: Lenze Swiss AG, Romanshorn (CH)

( * ) Notice: Subject to any disclaimer, the term of this patent is extended or adjusted under 35 U.S.C. 154(b) by 738 days.

(21) Appl. No.: 17/779,347

(22) PCT Filed: Nov. 24, 2020

(86) PCT No.: PCT/EP2020/083220
§ 371 (c)(1),
(2) Date: Sep. 30, 2022

(87) PCT Pub. No.: WO2021/105128
PCT Pub. Date: Jun. 3, 2021

(65) Prior Publication Data
US 2023/0049485 A1 Feb. 16, 2023

(30) Foreign Application Priority Data

Nov. 25, 2019 (DE) .................... 10 2019 218 210.0

(51) Int. Cl.
*H01R 4/66* (2006.01)
*H01R 12/51* (2011.01)
*H05K 5/02* (2006.01)

(52) U.S. Cl.
CPC ........... *H01R 12/51* (2013.01); *H05K 5/0247* (2013.01)

(58) Field of Classification Search
CPC .............................. H01R 12/51; H05K 5/0247
See application file for complete search history.

(56) References Cited

U.S. PATENT DOCUMENTS

| 6,019,614 | A | * | 2/2000 | Baur | .................... | H05K 9/0039 |
| | | | | | | 439/92 |
| 6,319,018 | B1 | * | 11/2001 | Daoud | ................. | H05K 1/0215 |
| | | | | | | 439/65 |
| 7,742,291 | B2 | | 6/2010 | Wu et al. | | |
| 8,384,394 | B2 | | 2/2013 | Kunii | | |

(Continued)

FOREIGN PATENT DOCUMENTS

| AT | 15512 U1 | 11/2017 |
| DE | 198 35 641 A1 | 2/2000 |

(Continued)

OTHER PUBLICATIONS

German-language European Opposition issued in European Application No. 20812285.3 dated Dec. 11, 2024 (20 pages).

(Continued)

*Primary Examiner* — Neil Abrams
(74) *Attorney, Agent, or Firm* — Crowell & Moring LLP

(57) ABSTRACT

An electric device includes: a housing having a first electrically conductive housing wall; and a first circuit board which is arranged in the housing and which has an electrical conductor. The first electrically conductive housing wall can be electrically conductively connected to the electrical conductor of the first circuit board by use of a screw connection.

10 Claims, 3 Drawing Sheets

(56) References Cited

U.S. PATENT DOCUMENTS

| | | | |
|---|---|---|---|
| 10,076,052 B2 | 9/2018 | Nikola et al. | |
| 10,658,769 B1* | 5/2020 | Shen .................... | G03B 21/145 |
| 2004/0209498 A1* | 10/2004 | Hatakeyama ........ | H01R 13/652 |
| | | | 439/97 |
| 2012/0119757 A1 | 5/2012 | Nakamura et al. | |

FOREIGN PATENT DOCUMENTS

| | | |
|---|---|---|
| DE | 10 2005 045 554 B3 | 4/2007 |
| DE | 10 2010 028 990 A1 | 12/2011 |
| DE | 10 2014 004 800 A1 | 10/2015 |
| WO | WO 2015/149907 A1 | 10/2015 |

OTHER PUBLICATIONS

International Search Report (PCT/ISA/210) issued in PCT Application No. PCT/EP2020/083220 dated Feb. 25, 2021 with English translation (four (4) pages).

German-language Written Opinion (PCT/ISA/237) issued in PCT Application No. PCT/EP2020/083220 dated Feb. 25, 2021 (six (6) pages).

German-language Office Action issued in German Application No. 10 2019 218 210.0 dated Nov. 6, 2020 (12 pages).

* cited by examiner

ELECTRIC DEVICE WITH PRINTED CIRCUIT BOARD

BACKGROUND AND SUMMARY

The invention relates to an electric device.

The object of the invention is the provision of electric device which can be produced in a simple and cost-effective manner.

The electric device comprises a housing having a first electrically conductive housing wall.

The electric device further comprises a first circuit board, which is arranged in the housing and which has a first electrical conductor.

The first electrically conductive housing wall is reversibly connectable to the first electrical conductor of the first circuit board, in an electrically conductive manner, by means of a screw connection.

According to one embodiment, the first circuit board is oriented perpendicularly to the first electrically conductive housing wall.

According to one embodiment, a carrier for the first circuit board is arranged on the first electrically conductive housing wall, or the first electrically conductive housing wall comprises a carrier for the first circuit board. In the mounting position thus provided, the first circuit board can engage with the carrier in two-dimensional contact.

According to one embodiment, the screw connection connects the first circuit board to the carrier in a mechanically detachable manner.

According to one embodiment, the carrier is connected to the first electrically conductive housing wall in an electrically conductive manner.

According to one embodiment, the first housing wall and the carrier are configured integrally.

According to one embodiment, the first electrically conductive housing wall and the carrier are configured in the form of a stamped and bent part. In particular, in a first processing step, the electrically conductive housing wall, in the predefined region of the carrier, is stamped into a U-shape, wherein, further to stamping, the carrier is bent inwards, i.e. the carrier is then bent into the interior of the housing, and is then preferably oriented perpendicularly to the electrically conductive housing wall. Alternatively, the carrier can also be connected to the first electrically conductive housing wall by means of a soldered or welded connection.

According to one embodiment, the electric device is provided with reach-through protection for the closure of an opening in the first electrically conductive housing wall, which is formed by the carrier which is bent into the interior of the housing, particularly for the achievement of a specific protection rating, for example IP 20 or IP 31. A second housing wall, which is arranged adjacently and perpendicularly to the first housing wall, particularly a cover, can comprise the reach-through protection.

According to one embodiment, a bolt of the screw connection comprises a longitudinal extension, which is oriented perpendicularly to the first circuit board.

According to one embodiment, the electric device comprises a second circuit board, which is oriented in a plane-parallel arrangement to the first electrically conductive housing wall, wherein the second circuit board retains the first circuit board, additionally to the carrier of the first electrically conductive housing wall. The second circuit board can be oriented with a specific plane-parallel clearance to the first electrically conductive housing wall, wherein the first circuit board is mechanically secured on one side by the carrier of the first electrically conductive housing wall, and is mechanically secured on the other side by the second circuit board.

According to one embodiment, the first circuit board comprises a second electrical conductor. The electric device comprises further conventional radio interference suppression components, for example radio interference suppression capacitors, radio interference suppression reactors, etc. Radio interference suppression components are arranged on the first circuit board, and are electrically connected to the second electrical conductor. The second electrical conductor is/can be electrically connected to the first electrical conductor by means of screw connection, or by the existing screw connection. Correspondingly, the second electrical conductor is/can be electrically isolated from the first electrical conductor, where the screw connection is removed or released.

According to one embodiment, the electric device has a TT (protective grounding) grid connection arrangement, or a TN (grounded neutral point) grid connection arrangement, provided that the first electrically conductive housing wall is connected to the first electrical conductor of the first circuit board by means of the screw connection in an electrically conductive manner. If the first electrically conductive housing wall is not connected to the first electrical conductor of the first circuit board by means of the screw connection in an electrically conductive manner, the electric device assumes an IT (isolated ground) grid connection arrangement.

The electric device can be, for example, a power converter, particularly in the form of a frequency converter or a regenerative power supply unit. A regenerative power supply unit injects electrical energy/power which is present, for example, in an intermediate circuit, back into a power supply grid. For further information, reference should be made to the relevant specialized literature.

The invention is described in detail hereinafter, with reference to the drawings.

DETAILED DESCRIPTION OF THE DRAWINGS

Figure 1:
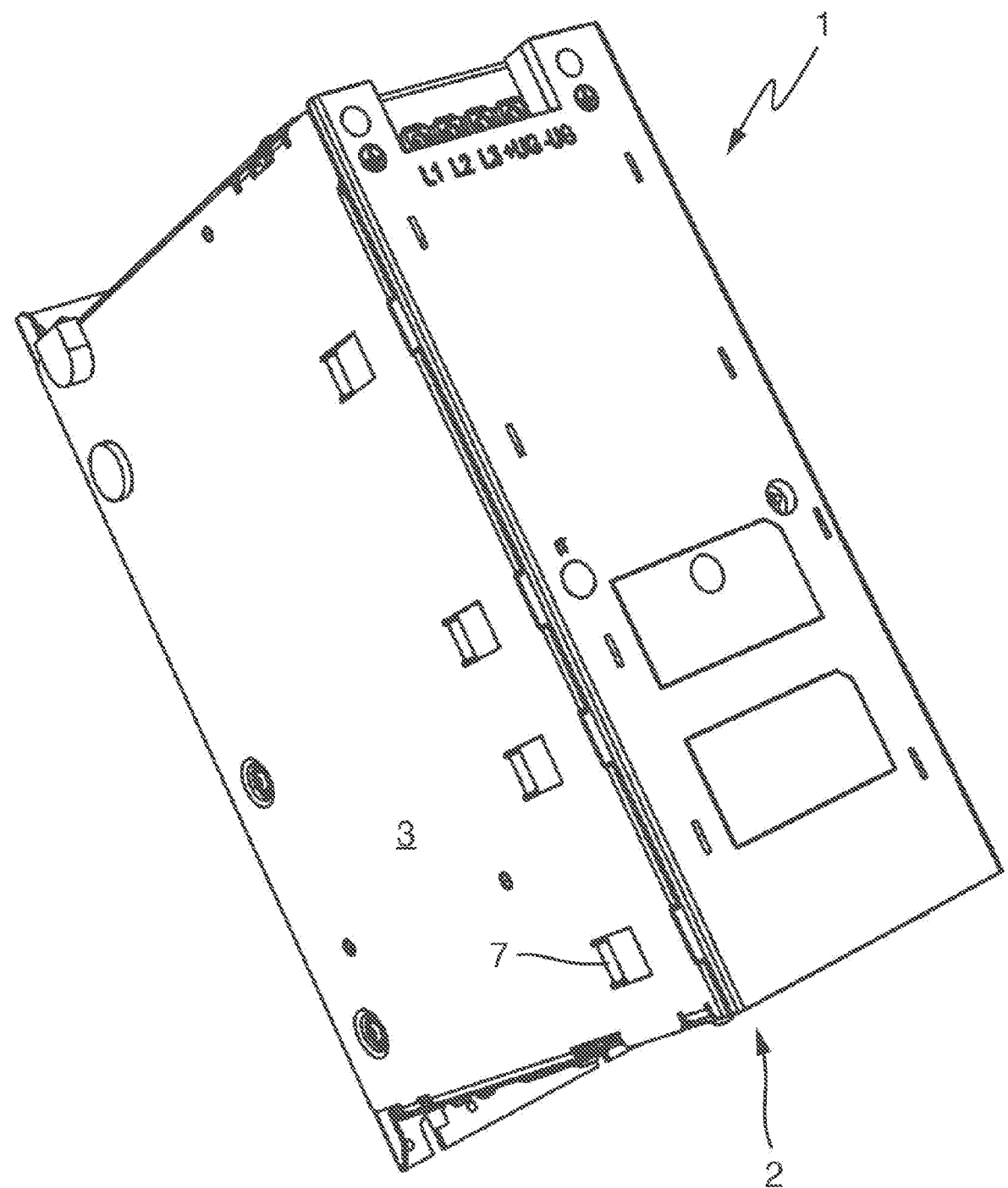
FIG. 1 shows a perspective view of an electric device.

FIG. 1 shows a perspective view of an electric device 1, for example in the form of a frequency converter.

The electric device 1 comprises a housing 2 having a first electrically conductive housing wall 3 and further housing walls, which are not designated in any greater detail and which, in combination, form the housing 2 of the electric device 1.

Figure 2:
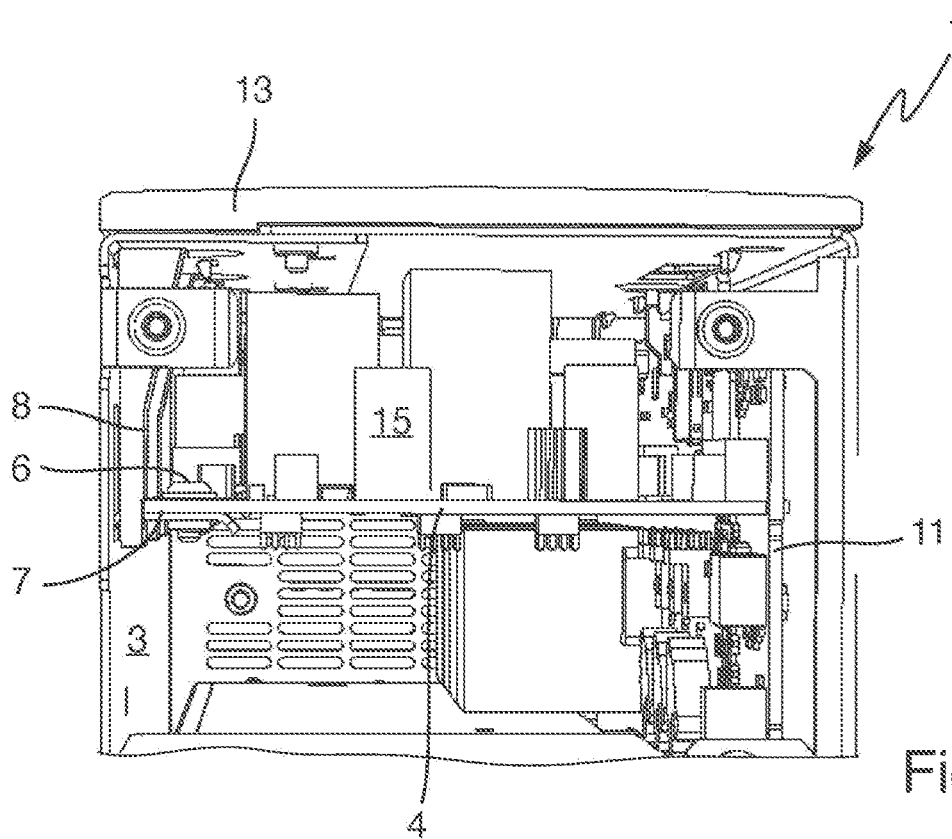
FIG. 2 shows a perspective view of the electric device according to FIG. 1, in a partially opened state.
Figure 3:
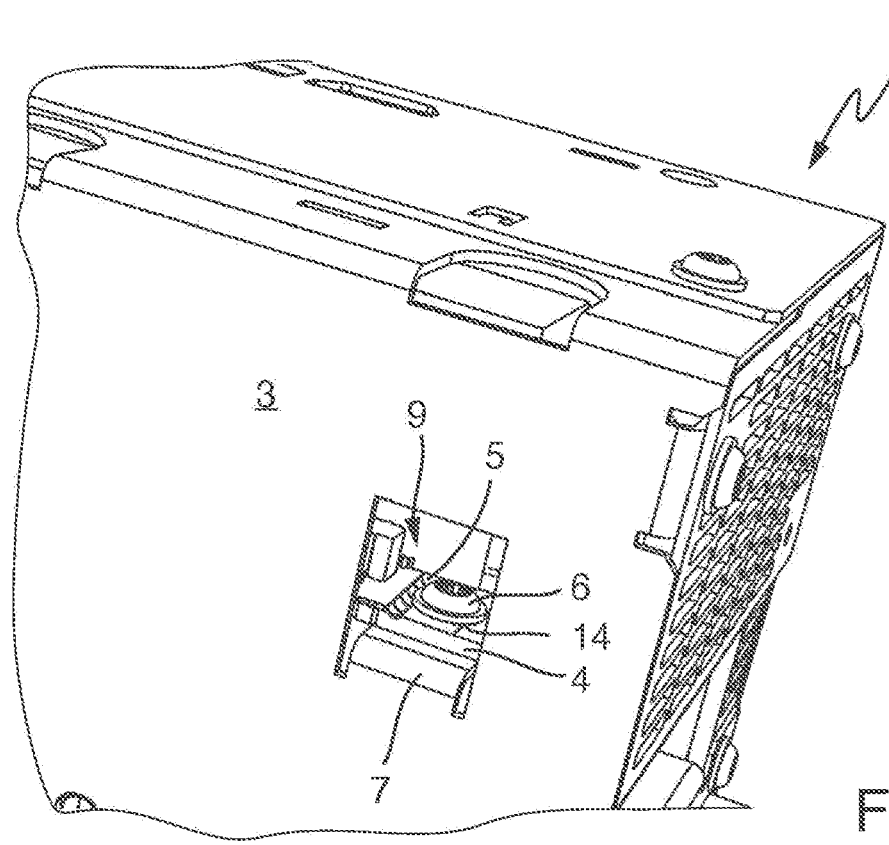
FIG. 3 shows a perspective view of a housing wall of the electric device according to FIG. 1, with a carrier which is bent into the interior of the housing.
Figure 4:
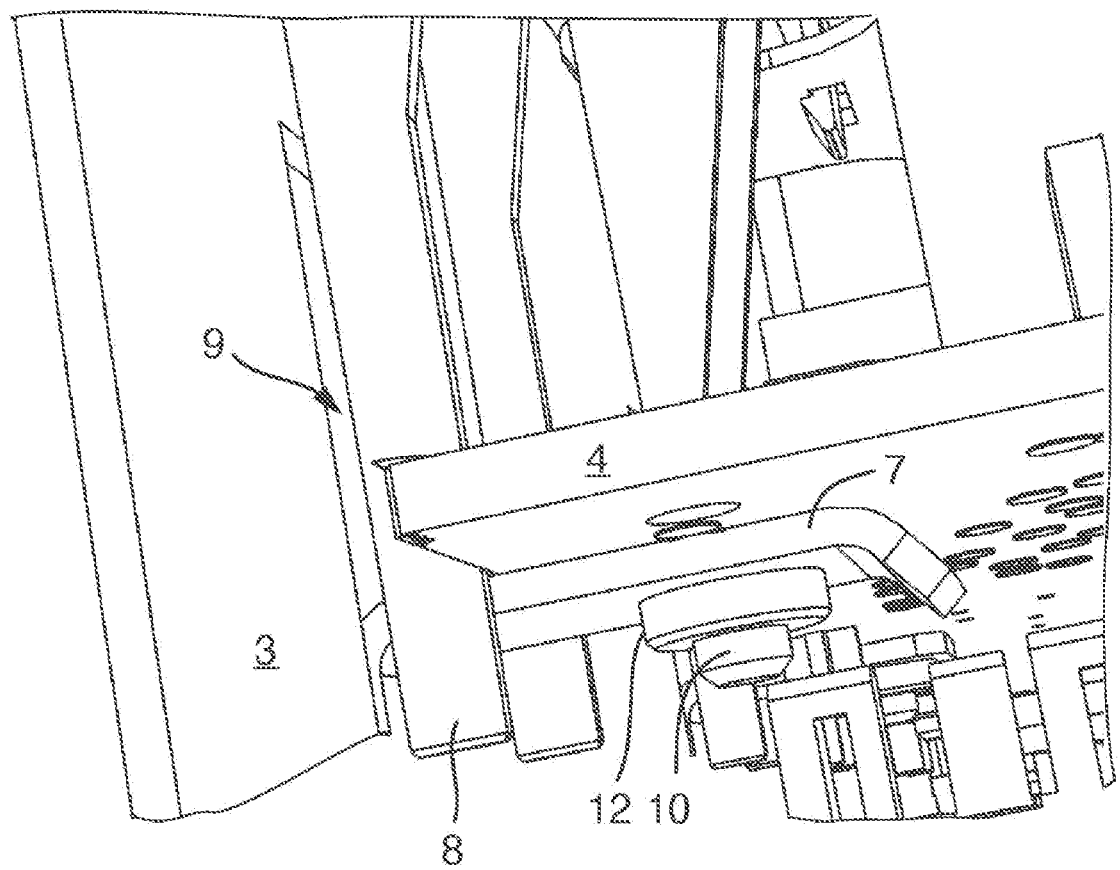
FIG. 4 shows a perspective view of the housing interior of the electric device according to FIG. 1.

With reference to FIGS. 2 to 4, the electric device 1 comprises a first circuit board 4 having a multiplicity of components arranged thereupon, wherein the first circuit board 4 is arranged in the housing 2.

The first circuit board 4 comprises a first electrical conductor 5, in the form of a conductor rail—c.f. FIG. 3. Naturally, in addition to the first electrical conductor 5, the first circuit board 4 further comprises a multiplicity of further electrical conductors/printed conductors which, however, in the interests of the more effective representation of features which are key to the invention, are not represented.

With reference to FIG. 3, which shows the electric device 1 from another perspective, the first electrically conductive housing wall 3 is connected to the first electrical conductor 5 of the first circuit board 4, in an electrically conductive manner, by means of a removable screw connection 6.

The first circuit board 4 is oriented perpendicularly to the first electrically conductive housing wall 3.

On the first electrically conductive housing wall 3, a carrier 7 is configured for the first circuit board 4, wherein the first housing wall 3 and the carrier 7 are integrally embodied in the form of a stamped and bent part. The carrier 7 is bent into the interior of the housing 2.

The screw connection 6 connects the first circuit board 4 to the carrier 7 in a mechanically detachable manner.

The screw connection 6 is formed by means of a bolt 10—c.f. in particular FIG. 4—and a nut 12 which is press-fitted in the carrier 7, wherein the bolt 10 engages with the nut 12 through an associated opening in the circuit board 4, and thereafter through an associated opening in the carrier 7. It is understood that a bolt head of the bolt 10 assumes a diameter which is greater than that of the opening in the circuit board. In the screwed-in state, the bolt 10 has a longitudinal extension, which is oriented perpendicularly to the first circuit board 4.

With reference to FIG. 4, the electric device 1 is provided with reach-through protection 8 for the closure of an opening 9 in the first electrically conductive housing wall 3, which is formed by the carrier 7 which is bent into the interior of the housing 2. The reach-through protection 8 can be a constituent of a cover 13—c.f. FIG. 2.

With reference to FIG. 2, the electric device 1 comprises a second circuit board 11, which is oriented in a plane-parallel arrangement, in opposition to the first electrically conductive housing wall 3, wherein the second circuit board 11 retains or braces the first circuit board 4.

If the first electrically conductive housing wall 3 is connected to the first electrical conductor 5 of the first circuit board 4 by means of the screw connection 6, in an electrically conductive manner, the electric device 1 has a TT grid connection arrangement, or a TN grid connection arrangement.

If the first electrically conductive housing wall 3 is not connected to the first electrical conductor 5 of the first circuit board 4 by means of the screw connection 6, in an electrically conductive manner, i.e. if the bolt 10 is not screwed in, the electric device 1 has an IT grid connection arrangement.

Screwing-in of the bolt 12 can mutually electrically connect various regions of the first circuit board 4 which, with the bolt 12 not screwed-in, are electrically isolated from one another. This feature can be employed, for example, for the setting of the connection arrangements described. In particular, radio interference suppression components can be deactivated by the removal of the bolt 12, or activated by the screwing-in of the bolt 12.

To this end, the first circuit board 4 comprises a second electrical conductor 14. The electric device 1 comprises further radio interference suppression components 15, which are arranged on the first circuit board 4 and are electrically connected with the second electrical conductor 14. The second electrical conductor 14 is electrically connected to the first electrical conductor 5 by means of the screw connection such that, in this case, radio interference suppression components 15 are activated. By the release of the screw connection, radio interference suppression components 15 are deactivated.

The second electrical conductor 14 can be electrically connected to the first electrical conductor 5, for example by means of the screw connection, such that an electrically conductive bolt head, in a fully screwed-in state, simultaneously engages with the first electrical conductor 5 and the second electrical conductor 14.

In IT networks, radio interference suppression components 15 are typically deactivated, i.e. no screw connection is present.

On the first housing wall 3, further carriers can be provided, which are mechanically configured in the manner of the first carrier, and which fulfil the same retention function, but which permit no grid arrangement selection function (IT, TN, etc.).

The invention claimed is:

1. An electric device, comprising:
    a housing having a first electrically conductive housing wall; and
    a first circuit board, which is arranged in the housing and which has a first electrical conductor,
    wherein the first electrically conductive housing wall is connectable to the first electrical conductor of the first circuit board, in an electrically conductive manner, by way of a screw connection;
    a carrier for the first circuit board arranged on the first electrically conductive housing wall,
    wherein the carrier is connected to the first electrically conductive housing wall in an electrically conductive manner, and
    wherein the first electrically conductive housing wall and the carrier are configured as a stamped and bent part.

2. The electric device according to claim 1, wherein the first circuit board is oriented perpendicularly to the first electrically conductive housing wall.

3. The electric device according to claim 1, wherein the screw connection connects the first circuit board to the carrier in a mechanically detachable manner.

4. The electric device according to claim 1, wherein the first housing wall and the carrier are configured integrally.

5. The electric device according to claim 1, wherein the carrier has a bend into an interior of the housing.

6. The electric device according to claim 5, further comprising:
    a reach-through protector for closure of an opening in the first electrically conductive housing wall, which opening is formed by the carrier which is bent into the interior of the housing.

7. The electric device according to claim 1, wherein a bolt of the screw connection comprises a longitudinal extension, which extension is oriented perpendicularly to the first circuit board.

8. An electric device, comprising:
    a housing having a first electrically conductive housing wall;
    a first circuit board, which is arranged in the housing and which has a first electrical conductor,
    wherein the first electrically conductive housing wall is connectable to the first electrical conductor of the first circuit board, in an electrically conductive manner, by way of a screw connection; and a second circuit board, which is oriented in a plane-parallel arrangement to the first electrically conductive housing wall, wherein the second circuit board retains the first circuit board.

9. An electric device, comprising:
a housing having a first electrically conductive housing wall; and
a first circuit board, which is arranged in the housing and which has a first electrical conductor,
wherein the first electrically conductive housing wall is connectable to the first electrical conductor of the first circuit board, in an electrically conductive manner, by way of a screw connection,
wherein the first circuit board comprises a second electrical conductor,
wherein the electric device further comprises radio interference suppression components, which are arranged on the first circuit board, and are electrically connected to the second electrical conductor in an electrically conductive manner, and
wherein the second electrical conductor is connected to the first electrical conductor, in an electrically conductive manner, by way of the screw connection.

10. An electric device, comprising:
a housing having a first electrically conductive housing wall; and
a first circuit board, which is arranged in the housing and which has a first electrical conductor,
wherein the first electrically conductive housing wall is connectable to the first electrical conductor of the first circuit board, in an electrically conductive manner, by way of a screw connection, wherein
the electric device has a TT grid connection arrangement or a TN grid connection arrangement, provided that the first electrically conductive housing wall is connected to the first electrical conductor of the first circuit board by way of the screw connection in an electrically conductive manner,
and
the electric device assumes an IT grid connection arrangement, when the first electrically conductive housing wall is not connected to the first electrical conductor of the first circuit board by way of the screw connection in an electrically conductive manner.

* * * * *